United States Patent [19]
Akai et al.

[11] 3,933,538
[45] Jan. 20, 1976

[54] METHOD AND APPARATUS FOR PRODUCTION OF LIQUID PHASE EPITAXIAL LAYERS OF SEMICONDUCTORS

[75] Inventors: Shin-ichi Akai; Hideki Mori; Nobuo Takahashi; Shin-ichi Iguchi, all of Osaka, Japan

[73] Assignee: Sumitomo Electric Industries, Ltd., Osaka, Japan

[22] Filed: Jan. 10, 1973

[21] Appl. No.: 322,522

[30] Foreign Application Priority Data
Jan. 18, 1972 Japan............................ 47-7040
Jan. 19, 1972 Japan............................ 47-7828
Jan. 19, 1972 Japan............................ 47-7829
Jan. 28, 1972 Japan............................ 47-10645

[52] U.S. Cl. ............... 148/171; 148/172; 148/173; 252/62.3 GA
[51] Int. Cl.²............................................ H01L 7/38
[58] Field of Search .......................... 148/171–173; 252/62.3 GA

[56] References Cited
UNITED STATES PATENTS

| | | | |
|---|---|---|---|
| 3,537,029 | 10/1970 | Kressel et al. ................. | 148/171 X |
| 3,631,836 | 1/1972 | Jarvela et al.................... | 148/171 X |
| 3,713,900 | 1/1973 | Suzuki ............................ | 148/172 X |
| 3,785,885 | 1/1974 | Stone............................... | 148/172 |

*Primary Examiner*—G. Ozaki
*Attorney, Agent, or Firm*—Carothers and Carothers

[57] ABSTRACT

Single-crystal epitaxial layers of compound semiconductors or mixed semiconductors are grown on suitable substrates from the liquid phase, which consists of a molten metallic solvent dissolving a source material of the semiconductors, and within which the temperature gradient is produced so that in a high temperature region of the liquid solution a solid source material is dissolving into the liquid solution with at least a portion of the solid source material always at an undissolved state and in a low temperature region of the liquid solution an epitaxial layer is depositing onto the substrate, the temperatures in the liquid solution being kept constant during the epitaxial growth. Each substrate is positioned in one of a number of slots which are provided in the upper surface of a slider and it is successively transferred with the slider to contact with the liquid solution. The composition and/or the doping level of each epitaxial layer are controlled by the composition and/or the doping level of the solid source material which is selected from a pre-synthesized material, i.e., a solid film produced on the liquid solution by supersaturation and a film deposited on the liquid solution from the vapor phase.

13 Claims, 5 Drawing Figures

METHOD AND APPARATUS FOR PRODUCTION OF LIQUID PHASE EPITAXIAL LAYERS OF SEMICONDUCTORS

BACKGROUND OF THE INVENTION

The present invention relates to the production of single-crystal epitaxial layers of semiconductors having a ternary or more multi-component homogeneous composition and/or a uniform doping level in binary or more multi-component semiconductors, and particularly to the production of epitaxial layers from the liquid phase.

Generally, two methods of growing epitaxial layers from the liquid phase have been known. One method comprises contacting a liquid solution saturated with a source material of semiconductor to be grown with a suitable substrate and then slowly cooling the temperature of the solution to grow an epitaxial layer on the substrate. For a detailed description, see H. Nelson, "Epitaxial Growth from the Liquid State and Its Application to the Fabrication of Tunnel and Laser Diodes", RCA Review 24, p. 603, 1963. Hereinafter, this method will be referred to as the "slowly-cooling liquid phase epitaxial growth method". The second method comprises producing a temperature gradient in the liquid solution so that in a high temperature region of the liquid solution a source material of the semiconductor to be grown is being supplied and in a low temperature region of the liquid solution an epitaxial layer is depositing onto the substrate contacted with the liquid solution. In the second method, the semiconductor to be grown is transferred from the high temperature region to the low temperature region by diffusion through the liquid solution according to the temperature gradient of the liquid solution. For a detailed description, see G. B. Stringfellow and P. E. Green, "Liquid Phase Epitaxial Growth of $InAs_{1-x}Sb_x$", Journal of Electrochemical Society, Vol. 118, No. 5, p. 805, (1971). This method will be referred to hereinafter as the "temperature-gradient liquid phase epitaxial growth method", though it is also called "steady-state liquid phase epitaxial growth method".

According to the first method, i.e. "slowly-cooling liquid phase epitaxial growth method", it is difficult to grow epitaxial layers on many substrates successively by using a liquid solution, since concentrations of the source material and of an impurity as a dopant in the liquid solution once used for the epitaxial growth are changed.

In the epitaxial growth of ternary semiconductors, change in composition occurs in a direction perpendicular to the growth surface and consequently the epitaxial growth of ternary semiconductors of a homogeneous composition becomes difficult. For example, in the case wherein an epitaxial layer of a ternary semiconductor $Ga_{1-x}Al_xAs$ ($0<x<1$) is grown on a GaAs substrate from a Ga-Al-GaAs mixed solution, Al concentration in an initially grown part is high and the Al concentration in the growing layer reduces rapidly thereafter. Thus, it is quite difficult to continuously grow single-crystal epitaxial layers of semiconductors having a homogeneous composition and/or uniform doping level by the first method.

Therefore, the use of the second method, i.e. "temperature-gradient liquid phase epitaxial growth method" is considered in this situation. For example, according to said report of Stringfellow et al., a homogeneous epitaxial layer of $InAs_{1-x}Sb_x$ ($0<x<1$) of about 80 μm is obtained by placing an InAs solid source in a high temperature region of an In-As-Sb ternary liquid solution and an InAs substrate in a low temperature region thereof. However, change of the liquid solution is also caused after a number of successive epitaxial growth steps.

In Official Gazette of the Japanese Patent No. 3711/1972, a method is disclosed which comprises floating a GaAs solid source on a Ga-Al-GaAs mixed solution to grow a relatively homogeneous epitaxial layer of $Ga_{1-x}Al_xAs$ ($0<x<1$) on the GaAs substrate positioned in a low temperature region. However, a change in composition of the liquid solution is also caused if one only keeps the steady state under the fixed temperature gradient condition, since Al in the solution is incorporated in a large amount in $Ga_{1-x}Al_xAs$. It is described therein that, for avoiding the change, a slow increase of the temperature of the whole solution as the growing proceeds is required, while the temperature gradient is always produced. Thus, change in temperature of the liquid solution is necessary as the epitaxial layer grows and, therefore, a number of continuous epitaxial growth operations are also difficult to obtain by this method.

DESCRIPTION OF THE INVENTION

According to the present invention, it is possible to successively grow single-crystal epitaxial layers of semiconductors having a ternary or more multi-component homogeneous composition and/or uniform doping level in binary or more multi-component semiconductors on many suitable substrates from the liquid phase. This can be applied to the following semiconductors: Group III-V semiconductors such as GaAs, GaP, InP, InSb, InAs, and GaN which are doped with at least one kind of impurity, Group III-V mixed semiconductors such as $GaAs_{1-x}P_x$, $GaAs_{1-x}Sb_x$, $InAs_{1-x}P_x$, $InAs_{1-x}Sb_x$, $Ga_{1-x}Al_xAs$, $Ga_{1-x}Al_xP$, $In_{1-x}Ga_xP$, $In_{1-x}Al_xP$, $In_{1-x}Al_xAs$, $Ga_{1-x}In_xN$ ($0<x<1$ in the foregoing semiconductors), $In_{1-y}Al_yAs_{1-x}P_x$, $In_{1-y}Ga_yAs_{1-x}P_x$, $Ga_{1-y}Al_yAs_{1-x}P_x$ ($0<x<1$, $0<y<1$ in the foregoing semiconductors), Group II-VI semiconductors such as CdTe, CdS, ZnSe, ZnTe, ZnO, and BeTe which are doped with at least one kind of impurity, Group II-VI mixed semiconductors such as $ZnSe_{1-x}Te_x$, $Cd_{1-x}Zn_xS$, $Zn_{1-x}Mg_xTe$, $Cd_{1-x}Mg_xTe$, $Hg_{1-x}Cd_xTe$ ($0<x<1$ in the foregoing semiconductors), and other semiconductors such as $(ZnS)_{1-x}(GaP)_x$, $(ZnSe)_{1-x}(GaAs)_x$ ($0<x<1$ in the foregoing semiconductors), $ZnSiP_2$, etc.

According to the present invention, single-crystal epitaxial layers of the above-mentioned various semiconductors are grown on suitable substrates from the liquid phase which consists of a molten metallic solvent dissolving a source material of the semiconductors and within which the temperature gradient is produced so that in a high temperature region of the liquid solution a solid source material is dissolving into the liquid solution, with at least a portion of the solid source material always at an undissolved state and in a low temperature region of the liquid solution an epitaxial layer is depositing onto the substrate, the temperatures in the liquid solution being kept constant during the epitaxial growth. Each substrate is positioned in one of the slots which are provided in the upper surface of a slider and it is successively transferred with the slider to contact with the liquid solution. The composition and/or the doping level of each epitaxial layer are controlled by the composition and/or doping level of the solid source material. The solid source material may be selected from a pre-synthesized material, a solid film produced on the liquid solution by supersaturation, a film deposited on the liquid solution from vapor phase or a mixture thereof wherein the undissolved solid source material and the semiconductor to be grown have substantially equal compositions and/or doping levels.

In this connection, the metallic solvent, a source material and a suitable substrate should be selected properly depending upon the kind of epitaxial layer to be grown. Examples of them will be shown in the following Table together with the atmospheres in which the liquid solution is positioned. The binary semiconductors such as GaAs, GaP, GaN, ZnTe in the following table mean the semiconductors which are doped with at least one kind of impurity.

of $Ga(CH_3)_3$ vapor, and $PH_3$ vapor in a suitable proportion onto a metallic solvent such as Ga or Pb, $GaAs_{1-x}P_x$ is deposited on the solution. The source material can be synthesized also by this process in situ during epitaxial growth. A combination of a pre-synthesized material and a material produced in situ during epitaxial growth may be used.

An object of the invention is to provide a method of successively growing single-crystal epitaxial layers of semiconductors having a homogeneous composition and/or uniform doping level on many suitable substrates from the liquid phase.

Another object of the invention is to provide an improved temperature-gradient liquid phase epitaxial growth method.

Still another object of the invention is to provide an apparatus for growing epitaxial layers suitable for car-

| examples of epitaxial layers to be deposited | examples of metallic solvents | examples of source materials | examples of substrates | atmospheres |
|---|---|---|---|---|
| GaAs | Ga, Sn | GaAs | GaAs, $MgGa_2O_4$, GaP | $H_2, N_2, H_2\text{-}N_2$ Ar, vacuum |
| GaP | Ga, Sn, In, Pb | GaP | GaP, GaAs, Si | " |
| GaN | Ga, Bi, Ga-Bi, InBi | GaN | GaN, $Al_2O_3$, $MgAl_2O_4$, ZnO, SiC | $H_2\text{-}NH_3$, $NH_3$, nitrogen plasma, active nitrogen |
| $Ga_{1-x}Al_xAs$ | Ga, Ga-Al | AlAs and GaAs, $Ga_{1-x}Al_xAs$ ($0<x<1$) | GaAs, GaP, $MgGa_2O_4$ | $H_2, N_2$, $H_2\text{-}N_2$, Ar, vacuum |
| $GaAs_{1-x}P_x$ ($0<x<1$) | Ga, Pb | GaP and GaAs, $GaAs_{1-x}P_x$ ($0<x<1$) | GaP, $MgGa_2O_4$ | " |
| $Ga_{1-x}Al_xP$ ($0<x<1$) | Ga, Ga-Al, Ga-In | AlP and GaP, $Ga_{1-x}Al_xP$ ($0<x<1$) | GaP, AlP/GaP* | " |
| $In_{1-x}Ga_xP$ ($0<x<1$) | Ga, In, Ga-In | GaP and InP, $In_{1-x}Ga_xP$ ($0<x<1$) | GaP, GaAs | " |
| $In_{1-x}Al_xP$ ($0<x<1$) | In, InBi, InSb, In-Al | AlP and InP, $In_{1-x}Al_xP$ ($0<x<1$) | GaAs, GaP, AlP/GaP* | $H_2, N_2$, $H_2\text{-}N_2$, Ar, vacuum |
| $In_{1-x}Ga_xSb$ ($0<x<1$) | In, In-Ga, Sb, InBi, Bi | GaSb and InSb, $In_{1-x}Ga_xSb$ ($0<x<1$) | GaSb, AlSb, InP | " |
| ZnTe | Ga, Bi | ZnTe | ZnTe, GaAs | |

*a substrate which is produced by growing a thin epitaxial layer of AlP on GaP substrate.

For controlling the doping level, a suitable amount of a dopant should be introduced in the metallic solvent and a doped source should be used as the source material.

A pre-synthesized material may be used as the solid source material. For example, a source material comprising $GaAs_{1-x}P_x$ ($0<x<1$) may be synthesized by mixing GaAs powder with GaP powder in a proportion of $(1-x):(x)$, pressing the mixture, and annealing it in a suitable atmosphere (such as that containing As and P). In case Ga solvent is used, a mixed vapor of As and P kept in a suitable proportion is contacted with a Ga solution to crystallize out a solid film of $GaAs_{1-x}P_x$ on the surface of the Ga solution by supersaturation. Thus, the solid source material can be produced in situ during epitaxial growth. Further, by introducing a gas mixture rying out the improved temperature-gradient liquid phase epitaxial growth method.

A further object of the invention is to provide an inexpensive method of producing epitaxial layers of the above-mentioned various semiconductors with a high rate of reproducibility.

Another object of the invention is to provide some new methods of synthesizing solid source materials required for carrying out the improved temperature-gradient liquid phase epitaxial growth method.

Another object of the invention is to provide a liquid phase epitaxial growth method particularly suitable for controlling compositions of ternary semiconductors.

Another particular object of the invention is to provide a liquid phase epitaxial growth method of growing epitaxial layers of Group III-V semiconductors at a high growth rate.

Another object of the invention is to provide a method of growing successive layers, i.e. liquid phase epitaxial layers, having a multi-layer structure of the above-mentioned various semiconductors.

A feature of the invention resides in the employment of an improved temperature-gradient liquid phase epitaxial growth method for growing single-crystal epitaxial layers of compound semiconductors or mixed semiconductors on suitable substrates from the liquid phase which consists of a molten metallic solvent dissolving a source material of the semiconductors. In the liquid solution, the temperature gradient is produced so that in a high temperature region of the solution a solid source material is dissolving into the liquid solution, with at least a portion of the solid source material always at an undissolved state and in a low temperature region of the liquid solution an epitaxial layer is depositing onto the substrate, the temperatures in the liquid solution being kept constant during the epitaxial growth.

Another feature of the invention resides in the improved temperature-gradient liquid phase epitaxial growth method wherein each substrate is positioned in one of slots which are provided in the upper surface of a slider and it is successively transfered with the slider to contact with the liquid solution and each substrate is kept in contact with the liquid solution for a predetermined time to effect successive liquid phase epitaxial growth.

Still another feature of the invention resides in the improved temperature-gradient liquid phase epitaxial growth method wherein the composition and/or the doping level in the liquid solution is controlled by selecting or controlling suitably the composition of the undissolved solid source material dissolving in the solution and/or doping level in the undissolved solid source material in a high temperature region of the liquid solution and, consequently, the composition and/or doping level in the epitaxial layer depositing on the suitable substrate is controlled in a low temperature region of the solution.

A further feature of the invention resides in an apparatus for growing a liquid phase epitaxial layer by the improved temperature-gradient liquid phase epitaxial growth method, which comprises; a vessel for containing a solution which is always saturated with the solid source material of the epitaxial layer to be grown, a rectangular reaction tube for installing therein a slider for successively transferring suitable substrates to be contacted with the solution, a heating means on one side of said rectangular reaction tube for producing a high temperature region, a heating means on the opposite side for producing a low temperature region, said slider being moved with its bottom kept to be contacted with an internal surface of said low temperature heating side of said rectangular reaction tube, while a uniform temperature-gradient is maintained from the high temperature side to the low temperature side of the solution in the vessel and a homogeneous temperature distribution is maintained on the contact surface between the substrate and the solution.

Another feature of the invention resides in the improved temperature-gradient liquid phase epitaxial growth method wherein plural liquid solutions of different composition or doping level are prepared to successively effect the multi-layer epitaxial growth on suitable substrates.

Another feature of the invention resides in the improved temperature-gradient liquid phase epitaxial growth method, wherein a gas mixture of a carrier gas such as hydrogen gas, nitrogen gas, argon gas or a mixture thereof and the vapor of the constituents of the epitaxial layer and/or the vapor of the volatile compounds of the constituents of the semiconductor is introduced onto a solid source material dissolving into the liquid solution in a high temperature region of the liquid solution to form fresh solid source material on said source material and at the same time to control the composition of said solid source material and the doping level by means of the composition of said gas mixture.

Another characteristic feature of the invention resides in the improved temperature-gradient liquid phase epitaxial growth method of growing an epitaxial layer of Group III–V mixed semiconductor $A^{III}B^{V}_{1-x}C^{V}_{x}$ ($0<x<1$) which is grown on a substrate selected from Group III–V semiconductors, wherein a film of mixed semiconductor $A^{III}B^{V}_{1-x}C^{V}_{x}$ is produced on the surface of said liquid solution by means of supersaturation by introducing a gas mixture containing the $B^{V}$, or the volatile compound of the $B^{V}$ element and $C^{V}$, or the volatile compound of the $C^{V}$ in a high temperature region of the liquid solution, and the numeral represented by $x$ is controlled by controlling the ratio of the partial pressure of the $B^{V}$ element to the partial pressure of the $C^{V}$ element in said gas mixture, $A^{III}$ being a Group III element (Al, Ga or In) and $B^{V}$ and $C^{V}$ being two different kinds of the Group V element selected from N, P, As or Sb.

EXAMPLES

The foregoing and other objects, features and advantages of this invention will be apparent from the following more particular description of preferred embodiments of the invention as illustrated in the accompanying drawings.

In the drawings:

FIG. 1 illustrates the first technique of this invention for growing the single-crystal epitaxial layers of semiconductors on suitable substrates by the improved temperature-gradient liquid phase epitaxial growth method. It comprises a diagrammatical cross sectional view of the apparatus for growing liquid phase epitaxial layers on the substrates with a solid source material, a liquid solution and many substrates.

It comprises a diagrammatic cross sectional view of the apparatus with a solid source material, a liquid solution, many substrates and a liquid source material which generates a gas mixture transported by a carrier gas.

Figure 3:
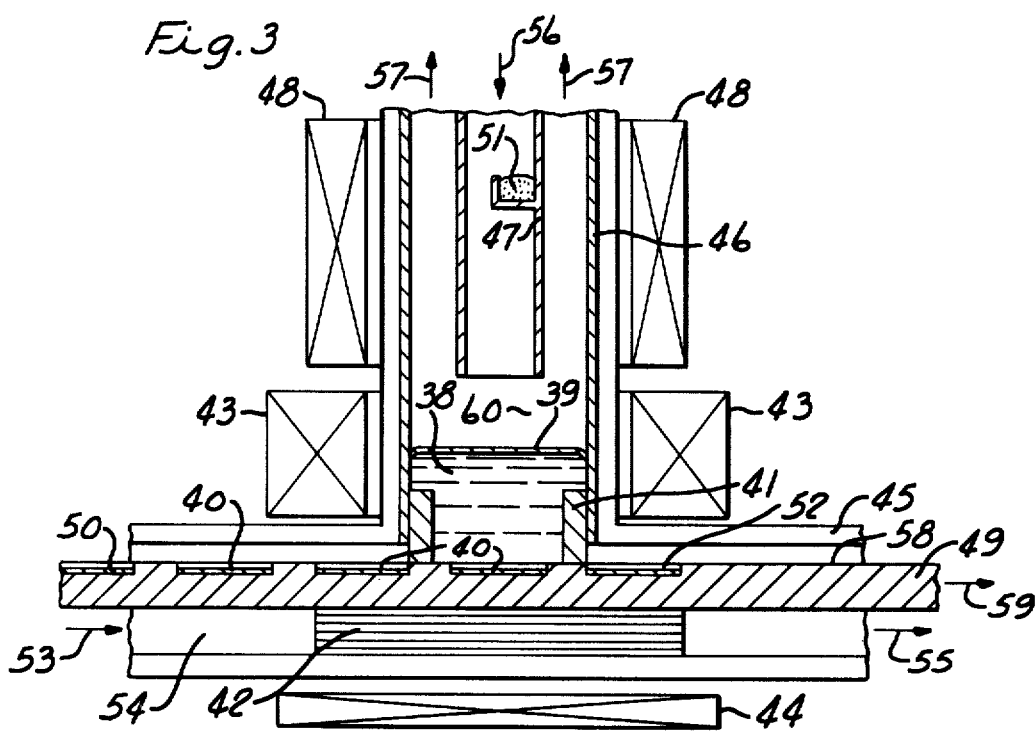
FIG. 3 shows another technique of this invention for growing the epitaxial layers of semiconductors on suitable substrate by the improved temperature-gradient liquid phase epitaxial growth method, wherein a solid source material is synthesized in situ during the epitaxial growth from a gas mixture transported by a carrier gas.
Figure 4:
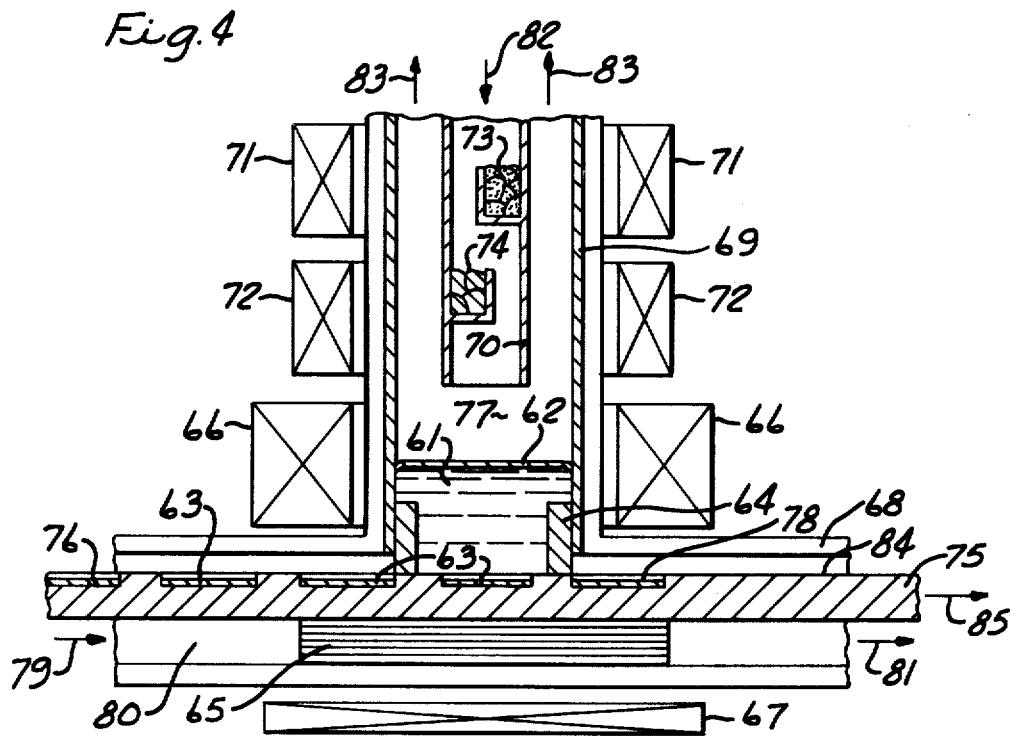

FIG. 4 shows the other technique of this invention similar to the technique of FIG. 3. It comprises a diagrammatic cross sectional view of the apparatus with a solid source material, a liquid solution, many substrates and two kinds of source material of the volatile components which generate an atmosphere of the vapor of the volatile components.

Figure 5:
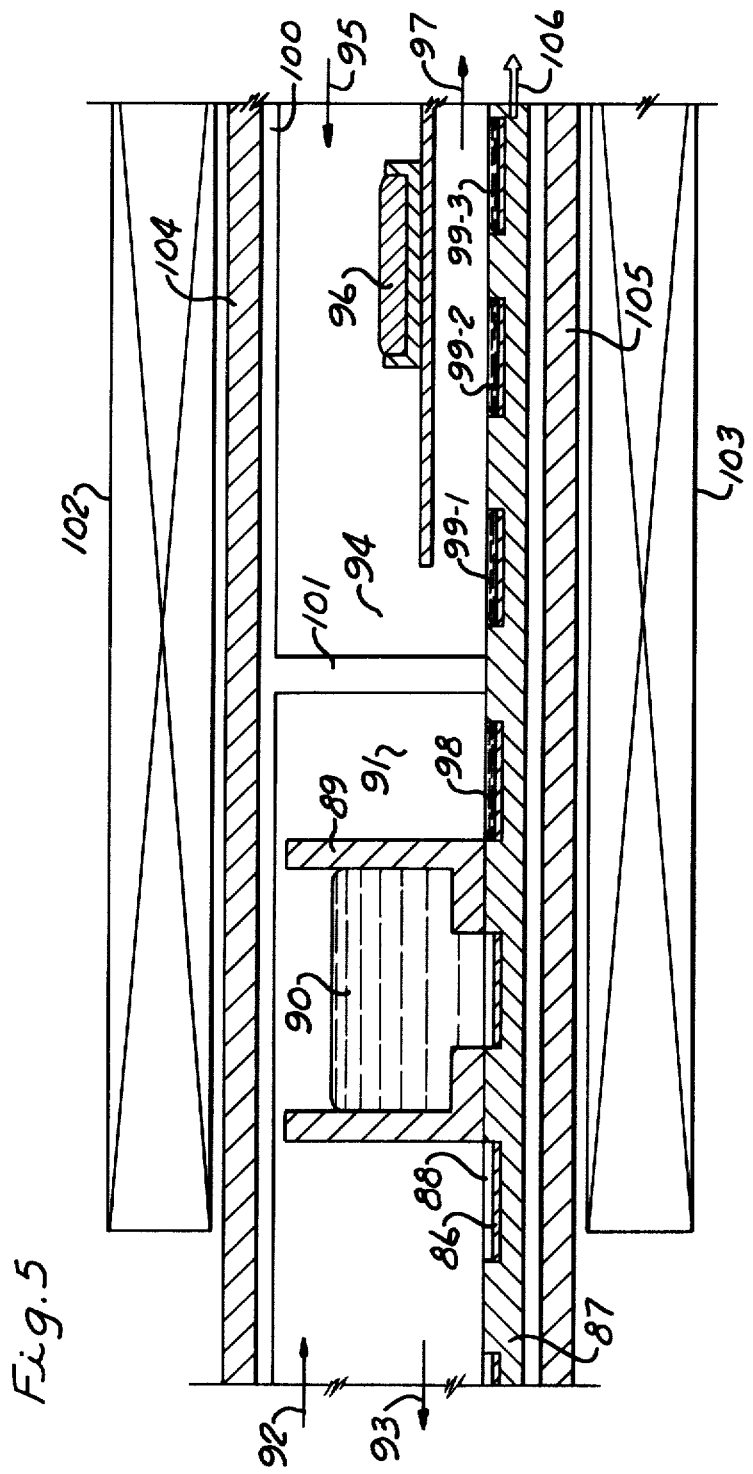

FIG. 5 illustrates another technique of this invention which is useful for growing the epitaxial layers especially of ternary semiconductors onto binary semiconductors.

It comprises a diagrammatic cross sectional view of the apparatus with one region for supplying a small amount of liquid solution onto each substrate from a large vessel containing a large amount of liquid solution and another region for growing epitaxial layers on the substrate by the improved temperaturegradient liquid phase epitaxial growth method.

The following are examples of the method of this invention for growing the single-crystal epitaxial layers of semiconductors on suitable substrates by the improved temperature-gradient liquid phase epitaxial growth method.

EXAMPLE 1

Figure 1:
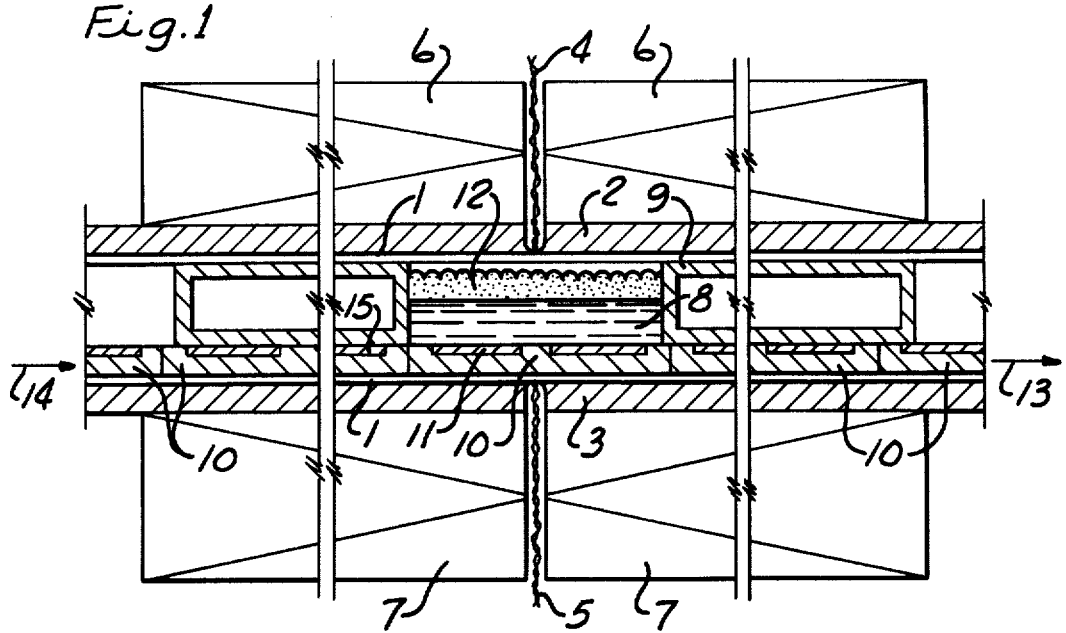

FIG. 1 is a cross section in the longitudinal direction of an apparatus for growing successive liquid phase epitaxial layers, which illustrates an embodiment of the invention.

In the figure, 1 is a quartz reaction tube having a rectangular section perpendicular to the longitudinal direction. The upper surface of the tube is contacted with a high thermal-conductivity plate 2 for uniforming the temperatures of the high temperature heating region and the lower surface is contacted with a high thermalconductivity plate 3 of the low temperature heating region. 4 and 5 are thermocouples for measuring and controlling the temperature of the high thermal-conductivity plates on the high and low temperature regions, respectively. 6 and 7 are electric furnaces on the high and low temperature sides, respectively. In the quartz reaction tube, a high purity graphite boat 9 is inserted in which a liquid solution 8 and a solid source material 12 are placed. Each suitable substrate 11 is positioned in each slot 15 placed in the upper surface of a slider 10. The substrate 11 is introduced in the lower portion of the liquid solution 8 in the direction of an arrow 14 to contact with the solution 8 for a predetermined time and thereafter drawn in the direction of an arrow 13. The above operation can be carried out nearly continuously by moving the slider 10 intermittently and successively.

The reasons why the quartz reaction tube having a rectangular section is used will be described below. If a quartz reaction tube of circular section is used, it is difficult to provide a uniform temperaturegradient from the higher temperature region to the lower temperature region and furthermore, it is also difficult to provide a homogeneous temperature profile in a horizontal plane in the lower temperature region. As a result, melt back in the liquid solution is caused in a part of the substrate while epitaxial growth is being caused in the other part thereof. On the other hand, if a quartz reaction tube of a rectangular section is used, these difficulties can be easily eliminated. This example was carried out in order to test the apparatus shown in FIG. 1. In this example, GaAs wafer was used as the substrate 11 and the liquid solution 8 was prepared from 50g of Ga and 11.0 g of GaAs polycrystal. By controlling temperatures of the thermocouples 4 and 5 to be about 950°C and about 880°C, a temperature-gradient of at least 1°C/cm was provided in the liquid solution 8. After attaining a thermally steady state, the first pair of GaAs wafers were contacted with the liquid solution 8 by means of the slider 10 and kept in this state for about 1 hour. Thereafter, the second pair of GaAs wafers were contacted with the solution 8. Thus, a respective pair of GaAs wafers was contacted with the solution 8 successively each for about one hour. The epitaxial growth can be effected substantially in a continuous manner until excess GaAs solid source 12 has been consumed. The thickness of the epitaxial layer grown was about 70μm. By providing a temperature difference of about 200°C between the upper and the lower portions of the liquid solution, a growth rate of about 300 μm/hr. can be obtained.

It is to be noted that, if the temperature difference between the thermocouples 4 and 5 is less than 30°C, melt back of the GaAs wafer as substrate in the liquid solution may occur. Namely, in the temperature-gradient liquid phase epitaxial growth method, precise control of temperature-gradient in the liquid solution is required. Accordingly, a roof is furnished for a portion of the boat 9 so that the roof tightly contacts the upper surface of the rectangular reaction tube to avoid influence of the direct radiant heat of the high temperature region upon the temperature of the low temperature region, thereby keeping the temperature–gradient uniform.

For increasing the temperature-gradient in the liquid solution, the high thermal-conductivity plate 3 may be contacted with a cooled gas.

EXAMPLE 2

Figure 2:
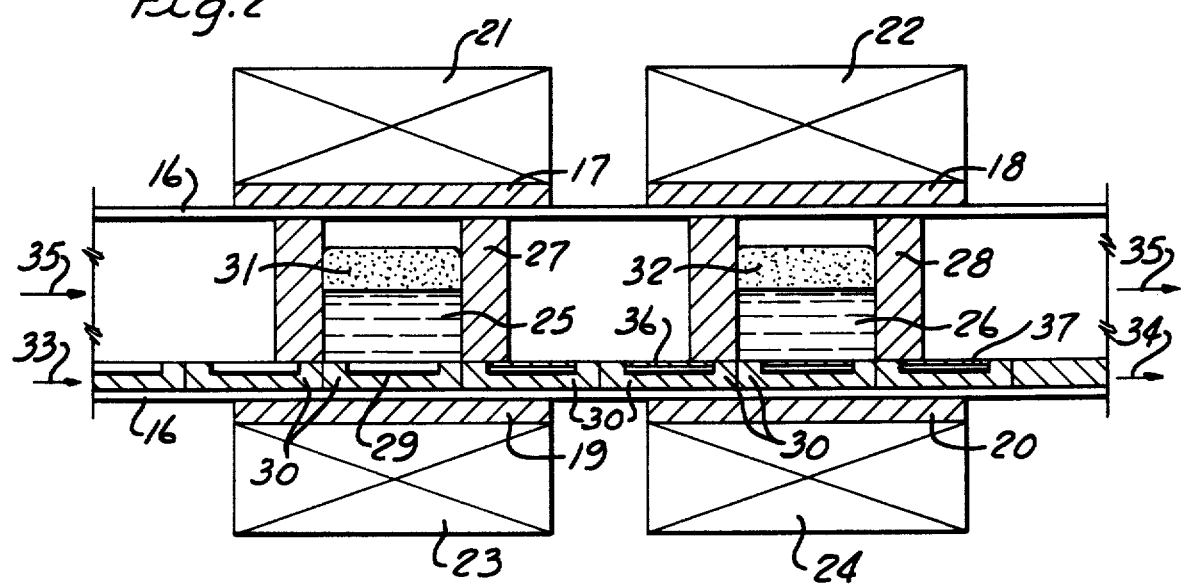
FIG. 2 illustrates the other technique of this invention which is applicable to the multi-layer epitaxial growth of semiconductors on suitable substrates, and which is used for growing the multiepitaxial layers successively on many substrates. It comprises a diagrammatic cross sectional view of the apparatus with two kinds of solid source material, two kinds of liquid solution and many substrates.

In this example, a double epitaxial layer of pGaAs/nGaAs was grown on a single-crystal substrate of $n^+$GaAs by using an apparatus as shown in FIG. 2. FIG. 2 is a cross section of a successive multi-layer epitaxial growth apparatus used in this example of the invention. In the figure, 16 is a quartz reaction tube having a rectangular section the upper surface of which is contacted with two high thermal-conductivity plates 17 and 18 of a high temperature region and the lower surface of which is contacted with two high thermal-conductivity plates 19 and 20 of a low temperature region.

Temperatures of the two heaters 21 and 22 in the high temperature region and the two heaters 23 and 24 in the low temperature region are controlled independently. The controlling thermocouple is not shown.

Crucibles 27 and 28 containing solutions 25 and 26 are positioned in the reaction tube 16. Sections of the crucibles 27 and 28 are also rectangular. 29 is a semiconductor substrate positioned in a slider 30. The substrate 29 is introduced in the direction of arrow 33 in solutions 25 and 26 on which the starting semiconductors 31 and 32 as solid source materials float and it is contacted with the solution 25 for a predetermined time and then with the solution 26. Thereafter, the substrate 29 is drawn in the direction of arrow 34. Multi-layer epitaxial layers can be obtained successively by carrying out the above operation successively in the presence of an inert gas or reducing gas stream 35. In case the starting semiconductors 31 and 32 have specific weights higher than those of the solutions 25 and 26, respectively, a diaphragm having, for example, slits may be provided between the starting semiconductor 31 and the solution 25 or between the starting semiconductor 32 and the solution 26 in order to permit contact of the solution with the starting semiconductor through the slits.

In this example, double epitaxial growth layers of pGaAs/nGaAs were grown by using the (111)Ga surface, i.e., (111) A surface of GaAs, of the crystallographic plane of a GaAs single-crystal as the substrate. Ga solution containing about 20 wt. % of GaAs was used as the solutions 25 and 26. Small amounts of Te and Zn were added to the solutions 25 and 26, respectively. Plate-form crystal of GaAs containing about 5 × $10^{17} cm^{-3}$ of Te was used as the starting semiconductor 31 and platy crystal GaAs containing about 1 × $10^{18} cm^{-3}$ of Zn was used as the starting semiconductor 32. The temperature of temperature-uniforming plates 17 and 18 was controlled to be 950°C, and temperature of the temperature-uniforming plates 19 and 20 was controlled to be 880°C. By the control, a temperature-gradient of at least 1°C/cm was produced in the solutions 25 and 26.

Under the above conditions, the substrate 29 was contacted with the solution 25 for one hour and then with the solution 26 for 30 minutes. Thus, about 50 μm of nGaAs epitaxial layer 36 doped with about 5 × $10^{17} cm^{-3}$ of Te and about 20 μm of pGaAs epitaxial layer 37 doped with about 8 × $10^{17} cm^{-3}$ of Zn were grown. Thus, uniform multi-layer epitaxial layers can be grown until the starting semiconductors 31 and 32 have been consumed by the successive epitaxial growth.

EXAMPLE 3

In this example, double epitaxial growth layers of $pGa_{1-x}In_xP/nGa_{1-x}In_xP$ were grown on single-crystal substrates of nGaP by using the same apparatus as in Example 2. Temperature conditions were the same as in Example 2. The substrate used was the (111)P surface, i.e., (111)B surface, of a nGaP single-crystal doped with about 5 × $10^{17} cm^{-3}$ of Te. The solutions 25 and 26 were mixed solutions of Ga and InP. Undoped $Ga_{1-x}In_xP$ platy crystal of x=4 was used as the starting semiconductors 31 and 32. A small amount of Te was added to the solution 25. A small amount of Zn was added to the solution 26. The substrate 29 was contacted with the solution 25 for 2 hours and with the solution 26 for 1 hour to grow about an 80 μm of $nGa_{0.6}In_{0.4}P$ layer 36 doped with about 3 × $10^{17} cm^{-3}$ of Te and about 40 μm of $pGa_{0.6}In_{0.4}P$ layer 37 doped with about 5 × $10^{17} cm^{-3}$ of Zn. In this case after about ten wafers were treated, doping levels of Te and Zn in the epitaxial layers were reduced to about ½ of the initial values. By using platy crystals of $nGa_{0.6}In_{0.4}P$ doped with about 3 × $10^{17} cm^{-3}$ of Te and $pGa_{0.6}In_{0.4}P$ doped with about 5 × $10^{17} cm^{-3}$ of Zn in place of the undoped $Ga_{1-x}In_xP$ as the starting semiconductors 31 and 32, the doping level can be kept constant during the repeated epitaxial growth operations.

Further, ternary epitaxial growth layers such as $p^+Ga_{1-x}Al_xAs/pGaAs/n^+Ga_{1-x}Al_xAs$ on $n^+GaAs$ substrate, $pGa_{1-x}Al_xP/pGaP$(isoelectronic nitrogen and an acceptor dope)/$nGa_{1-x}Al_xP$ on nGaP substrate and $p^+In_{1-x}Ga_xP/pIn_{1-y}Ga_yP/n^+In_{1-z}Ga_zP$, where $x > y$ and $z > y$, on $n^+GaAs$ substrate can be produced successively by providing three different solutions.

By contacting the substrates with two different solutions alternately, epitaxial multi-layers such as $In_{1-x}$ $Ga_xP/In_{1-y}Ga_yP/In_{1-x}Ga_xP/In_{1-y}Ga_yP/$ . . . and $(Ga_{1-x} Al_x)_yIn_{1-y}P/(Ga_{1-z}Al_z)_yIn_{1-y}P/(Ga_{1-x}Al_x)_yIn_{1-y}P/$ . . . . can be grown. These layers may be used for a so-called crystal having a man-made superlattice.

EXAMPLE 4

In Examples 1 through 3, pre-synthesized materials were used as the solid source materials (12 in FIG. 1; 31 and 32 in FIG. 2). However, in case epitaxial layers of the ternary compound $GaAs_{1-x}P_x$ are to be grown on GaP substrates or GaP epitaxial layers doped with both Zn and O are to be grown, it is better to synthesize the solid source material in situ during epitaxial growth. A temperature-gradient of at least 1°C/cm is provided in a solution saturated with a starting semiconductor having essentially the same composition as that of the epitaxial layer to be grown, said starting semiconductor is deposited in solid form on the surface of the solution in the high temperature region from the gas phase transported with the carrier gas. The composition of the starting semiconductor of the solid state and the doping level thereof are controlled by controlling the composition of the gas phase. Then the semiconductor substrate is contacted with the low temperature region of the solution while the starting semiconductor is dissolved in the solution to make the solution saturated whereby the epitaxial layer is formed on the substrate.

FIG. 3 is a vertical cross section of the liquid phase epitaxial growth apparatus used in this example.

In this example, $GaAs_{1-x}P_x$ epitaxial growth layers were formed on GaP single-crystal substrates. In the figure, 38 is a liquid solution consisting of Ga, GaAs and GaP, 39 is a solid source material of $GaAs_{1-x}P_x$ formed on the surface of the solution 38 and 40 is GaP single-crystal substrate. 41 is a graphite crucible having an open window at the bottom which crucible contains the solution 38. 42 is a heat sink which absorbs heat from the bottom of the solution 38. The heat sink 42 is made of graphite, BeO, etc. 43 is a heater for heating the liquid solution 38 and 44 is an auxiliary heater thereof. 45 is a quartz reaction tube. 46 is a carbon coating layer on the internal surface of the quartz reaction tube 45. 47 is a quartz internal tube positioned above the solution 38. 48 is a heater therefor. 49 is a graphite slider wherein each GaP single-crystal substrate is positioned in each slot 50. 52 is a $GaAs_{1-x}P_x$ growth layer formed on the substrate 40. 53 is an inlet of hydrogen gas 54, 55 is an outlet of the same, 56 is an inlet for hydrogen as carrier gas and 57 is an outlet for waste gas. The liquid solution 38 comprising about 200 g of Ga, about 5 atomic % of As and about 0.9 atomic % of P was prepared. The slider 49 was arranged so that a part 58 thereof free of the slot was positioned below the solution 38. The temperature of the solution was controlled to be about 950°C and a temperature-gradient of about 5°C/cm was provided between the top and the bottom of the solution 38. Thereafter, a mixture of hydrogen, arsenic trichloride ($AsCl_3$), phosphorus trichloride and $H_2Se$ as a dopant was introduced through the carrier gas inlet 56. The gas mixture reacted with Ga 51 to form a gas mixture 60 while GaCl was produced. From the gas mixture 60, $GaAs_{1-x}P_x$ was deposited on the solution 38. Value x of the $GaAs_{1-x}P_x$ formed was kept at about 0.6 by controlling the temperature of the heater 48 and the amount of the carrier gas stream. Then, the slider 49 was moved in the direction of arrow 59 to transfer the GaP substrate below the liquid solution 38 and to contact the substrate with the solution. About two hours later, the slider 49 was moved in the direction of the arrow 59. As the result, about 70 μm of a GaAs$_{1-x}$P$_x$ epitaxial layer ($x$=0.6) was formed. As the gas mixture 60, mixed gases such as a mixture of a volatile compound of Ga and a gas of As and P or a volatile compound of As and P may be used instead of the H$_2$/AsCl$_3$/PCl$_3$/Ga gas.

By this method, formation of a GaP epitaxial growth layer on GaP single-crystal substrate was also tried by using a mixed gas of GaCl and P gas. About a 50 μm growth was obtained during 2 hours.

In this example 4, by using In in place of Ga and InP substrate in place of GaP substrate, an epitaxial growth layer of InAs$_{1-x}$P$_x$ can be obtained. Further, by using Al(CH$_3$)$_3$ in place of AsCl$_3$, an epitaxial growth of Ga$_{1-x}$Al$_x$P on the GaP substrate in the Ga solution is possible.

In effecting epitaxial growth of Ga$_{1-x}$Al$_x$P, a gas mixture comprising Al (CH$_3$)$_3$, GaCl and PCl$_3$ may be used as the gas mixture 60. Ga$_{1-x}$Al$_x$P solid source material can also be synthesized easily on the solution in situ during epitaxial growth by simply introducing a gas mixture of Al(CH$_3$)$_3$ and PH$_3$ on the Ga solution.

EXAMPLE 5

FIG. 4 is a vertical cross section of a liquid phase epitaxial growth apparatus used in this example. The apparatus is essentially the same as in FIG. 3.

In this example, GaAs$_{1-x}$P$_x$ epitaxial growth layers were formed on GaP single-crystal substrates. In FIG. 4, 61 is a solution of source material comprising Ga, GaAs and GaP, 62 is a film of GaAs$_{1-x}$P$_x$ formed on the surface of the solution 61 and 63 is a GaP single-crystal substrate. 64 is a graphite crucible and 65 is a heat sink for absorbing heat from the bottom of the solution 61. The heat sink 65 is made of graphite, BeO or the like. 66 is a heater for heating the liquid solution 61, 67 is an auxiliary heater thereof and 68 is a quartz reaction tube. 69 is a carbon coating layer on the internal surface of the quartz reaction tube 68. 70 is an inside quartz tube above the solution 61. 71 and 72 are heaters for heating P 73 and As 74. 75 is a graphite slider in which each GaP single crystal substrate 63 is positioned in each slot 76. 78 is a GaAs$_{1-x}$P$_x$ growth layer. 79 is an inlet of hydrogen gas 80. 81 is an outlet thereof. 82 is an inlet of hydrogen as a carrier gas. 83 is an outlet for waste gas.

The liquid solution 61 comprising about 200 g of Ga, about 5 atomic % of As and about 0.9 atomic % of P was prepared. The slider 75 was arranged so that a part 84 thereof free of the slot was positioned below the solution 61. The temperature T of the solution was controlled to be about 950°C and a temperaturegradient of about 5°C/cm was provided between the top and the bottom of the solution 61, the temperature of the top surface being the highest. Thereafter, the temperatures of red phosphorus (P) 73 and As 74 were kept at 380°C and 430°C, respectively and hydrogen gas was introduced as the carrier gas through the gas inlet 82. The proportion of the partial pressure of P to the partial pressure of As was about 70. The gas mixture 77 was contacted with the solution 61 and a GaAs$_{1-x}$P$_x$ film was formed by supersaturation. The value for x of the GaAs$_{1-x}$P$_x$ film 62 formed under those conditions was about 0.6. Then, the slider 75 was moved in the direction of arrow 85 to transfer the GaP substrate 63 below the liquid solution 61 and to contact the substrate with the solution. After about two hours, the slider 75 was moved in the direction of arrow 85 to contact the next substrate 63 with the solution 61. Thus, by moving the slider 75 successively, epitaxial layers of about 50 μm thickness of GaAs$_{1-x}$P$_x$ ($x$=0.6) were formed on the respective substrates 63.

If the ratio of the partial pressure of P to the partial pressure of As is represented by γ, the following interrelationship was found between the value of x of the GaAs$_{1-x}$P$_x$ film 62 and γ, $$x/1-x \; \alpha K(T)\, \gamma^{1/4}$$

wherein K(T) is a function of only temperature T. The value γ may be changed at will by slightly changing the temperatures of heaters 71 and 72. For example, at a predetermined temperature T (72) of 430°C, γ ≅ 70 if T (71) is 380°C and γ ≅ 0.5 if T (71) is 260°C. It will be understood from the above equation that by varying the temperature T of the solution 61, the value of x may be varied, while γ is kept constant.

EXAMPLE 6

In this example, GaAs$_{1-x}$P$_x$ epitaxial layers were grown by using the apparatus shown in FIG. 4 in the same manner as in Example 5 except that the power to the heaters 71 and 72 was not supplied and that AsH$_3$ and PH$_3$ were introduced by using hydrogen as carrier gas through the gas inlet 82.

The value γ was controlled to be about 70 by changing the ratio of the gases. In the same manner as in Example 4, GaAs$_{1-x}$P$_x$ epitaxial layers were grown on GaP single-crystal substrates 63. The value of x of the resulting GaAs$_{1-x}$P$_x$ was also $x \cong 0.6$.

In this case, AsCl$_3$/PCl$_3$ may be used in place of AsH$_3$/PH$_3$ as the gas to be introduced. Further, other volatile compounds of As and P may be used and the value of x may be controlled by controlling the partial pressures of the vapors of As and P produced by the decomposition thereof.

In this example, a GaAs$_{1-x}$Sb$_x$ epitaxial growth layer may be obtained by using AsH$_3$ and SbH$_3$ in place of AsH$_3$ and PH$_3$ as the gas to be introduced and GaAs substrates in place of GaP substrates. By various combinations of substrate, liquid solution and gas source of the V group element, various epitaxial layers of A$^{III}$B$^V_{1-x}$C$^V_x$ mixed semiconductors as mentioned above may be grown.

EXAMPLE 7

This example represents an attempt to obtain a graded-composition liquid phase epitaxial layer. In this example, GaAs$_{1-x}$P$_x$ epitaxial layers in which x has a value changing gradually from 1 to about 0.6 nearly were grown on GaP single-crystal substrates by using the same apparatus as in Examples 5 and 6.

In the apparatus shown in FIG. 4, the starting solution 61 comprised a Ga-GaP solution saturated only with GaP. After contacting a GaP substrate with the solution, the temperature of the heater 72 was elevated to 380°C and then gradually to 430°C to form GaAs$_{1-x}$P$_x$ growth layers, x being a number changed gradually from 1 to about 0.6. However, in this case, successive contact of the GaP substrates with the solution should not be done because the solution contains both As and P, and therefore, the solution must be baked with only P vapor to expel the As after each growth operation. Successive contact of the GaP substrates with the solution is possible in order to grow a graded-composition liquid phase epitaxial layer, if one has some modification of the method.

The technique of Examples 6 and 7 may be applied to various combinations of the $A^{III}B^{V}_{1-x}C^{V}_{x}$ growth layer and the substrate such as $GaAs_{1-x}P_x$/GaP, $InAs_{1-x}P_x$/InP, $GaAs_{1-x}Sb_x$/GaAs and $InAs_{1-x}P_x$/GaAs.

The growth of $A^{III}B^{V}_{1-x}C^{V}$ mixed crystals having predetermined doping levels can be obtained by supplying a volatile dopant such as S, Se, Te or Zn together with the $B^V$ element or the $C^V$ element so that a partial pressure of the dopant is kept constant.

EXAMPLE 8

This example is a modification of the methods illustrated in FIGS. 1, 2, 3 and 4.

FIG. 5 is a vertical cross section of a liquid phase epitaxial growth apparatus used in this example.

It comprises a diagrammatic cross sectional view of the apparatus with one region for supplying a small amount of liquid solution onto each substrate from a large vessel containing a large amount of liquid solution and another region for growing epitaxial layers on the substrate by the improved temperature-gradient liquid phase epitaxial method.

In the figure, 86 is a single-crystal substrate. 87 is a slider, 88 is a slot, 89 is a crucible for supplying solution in which a solution 90 which is not saturated with a semiconductor to be epitaxially grown is contained. The solution 90 and the substrate 86 are kept clean in an atmosphere of an inert gas or a reducing gas 91 such as $H_2$ or $H_2-N_2$. The gas is introduced through an inlet 92 and exhausted through an outlet 93. 94 is an atmosphere of a gas mixture transported by a carrier gas. The gas comprises the carrier gas introduced through a gas inlet 95 and the gaseous reaction product formed from the reaction gas and a source material 96. The waste gas is taken out through an outlet 97. 98 is a layer of the solution not saturated with the semiconductor to be grown which is supplied onto a slot 88 from the crucible 89. The crucible 89 has suitably at least 5 times as much volume as the volume of the slot 88 for supplying the solution successively into many slots 88. 99-1, 99-2, 99-3, etc. are layers of the solution saturated with the semiconductor to be grown. 100 is a quartz reaction tube having a rectangular section. 101 is a diaphragm for separating the gas 91 in the left from the gas mixture 94 in the right. A temperature-gradient is provided between the top and the bottom of the solution 90 and 98, 99-1, 99-2, etc. by high temperature heater 102 and a low temperature heater or a heat sink 103, and a temperature uniforming plate 104 in a high temperature region and a temperature uniforming plate 105 in a low temperature region. With this, a temperature-gradient of from 1°C/cm to about 15°C/cm is provided between the top and the bottom of the solutions 98, 99-1, 99-2, etc. of about 100 μm to 2 mm thickness.

In this example, an S-doped GaP epitaxial layer was grown on the (III)P surface, i.e., (III)B surface of an n-GaP single-crystal doped with about $10^{18} cm^{-3}$ of Te grown by a "liquid encapsulation pulling technique". The temperature of the solution 90 was kept at about 1100°C by the heater 102. The solution 90 comprised 200 g of Ga added with 20 g of undoped GaP crystal and GaS. The GaS doping level was about $5 \times 10^{17} cm^{-3}$ as S. The solution 90 was slightly unsaturated with GaP at about 1100°C.

As the gas mixture 94, a gaseous reaction product of input gas 95 of $H_2/PCl_3$ and GaP polycrystal 96 was used. The solution layer 98 was slightly unsaturated with GaP and, consequently, a partial etching of the substrate 86 occured in this step. The solution layer 99-1 was slowly saturated with GaP. This is caused by the P gas and GaCl gas produced by the reaction of $H_2/PCl_3$ and GaP both of which gases are dissolved in the solution 99-1. If the gas mixture 94 has a sufficiently high partial pressure, GaP films are formed on the surface of the solutions 99-2 and 99-3. The filmy solid source material is dissolved in the surface of the solution 99-3 and GaP epitaxial growth is effected on the substrate 86. The slider 87 was moved in the direction of arrow 106 at an average speed of about 30 cm/hr. For example, the contacting time of the substrate 86 of about 2 cm diameter with the solution 90 was about 5 minutes. Thickness of the resulting growth layer was about 60 μm.

EXAMPLE 9

In this example, $GaAs_{1-x}P_x$ layers were grown on GaP substrates by using the same apparatus as in Example 8.

The same temperature conditions as in Example 8 were employed. The solution 90 comprised 200 g of Ga added with 30 g of GaP and GaS. The solution was being saturated with GaP. As the gas mixture 94, a gaseous reaction mixture from the input gas 95 comprising a mixture of $H_2/AsCl_3$ and $NH_3$ and GaP 96 was used. In this example, the solution 98 was saturated with GaP and, consequently, a growth layer of GaP doped with S began to grow on the GaP substrate in this step. Solution 99-1 is the step wherein x of $GaAs_{1-x}P_x$ is reduced gradually from 1. After the reduction of x to about 0.7, $GaAs_{1-x}P_x$ having the constant value of x was grown. The thickness of the growth layers was about 45 μm. The growth layers were doped with S and N.

EXAMPLE 10

In this example, $Ga_{1-x}Al_xP$ was grown on GaP substrates by using the same apparatus as in Example 8.

As the gas mixture 94, a gas mixture comprising $Al(CH_3)_3$ added with $NH_3$ and a gaseous reaction product from $H_2/PCl_3$ and GaP 96 was used. The same operations as in Example 9 were effected.

$Ga_{1-x}Al_xP$ layers doped with S and N comprising about 5 μm of $Ga_{1-x}Al_xP$ layers wherein x varies from zero to about 0.3 and about 40 μm of $Ga_{1-x}Al_xP$ layers wherein x is about 0.3 were grown.

In addition, epitaxial layers can be grown selectively if photo-etched patterns of $SiO_2$ or $Si_3N_4$ are provided previously on the single-crystal substrates.

While the invention has been particularly shown and described with reference to preferred embodiments thereof, it will be understood by those skilled in the art that the foregoing and other changes in form and details may be made therein without departing from the spirit and scope of the invention.

We claim:

1. A method for successively growing single crystal epitaxial layers of semiconductors which have the ternary or more multi-component homogeneous composition and/or uniform doping level in the binary or more multi-component semiconductors on suitable substrates from the liquid phase comprising the steps of:
    applying heat to a molten metallic solvent solution of a source material of said semiconductor and thereby establishing a temperature gradient therein with a high temperature region and a low temperature region;

contacting a solid source material with the high temperature region of said solution and thereby dissolving said source material into said high temperature region of said solution with at least a portion of said solid source material always at an undissolved state;

contacting at least one substrate surface with the low temperature region of said solution and thereby growing the epitaxial layers on the substrates by diffusion of the dissolved source material through said solution and supersaturation of said material in the low temperature region;

maintaining the temperatures in said solution constant during said epitaxial growth;

controlling the composition and/or doping level of said epitaxial layers by selecting substantially equal composition and/or doping level of the undissolved solid source material to said semiconductor to be grown;

removing said treated substrate from contact with said solution after a predetermined time and contacting at least one more substrate surface with said same solution for successive growth of epitaxial layers on a plurality of different substrate portions.

2. The method of claim 1 wherein the step of removing the substrate and contacting the solution with another substrate portion is carried out by the step of sliding the treated substrate out of contact with said solution and sliding the new substrate to be treated into contact with said solution while maintaining a slide seal preventing the leakage of said solution.

3. A method as described in claim 1 wherein the temperature-gradient is at least 1°C/cm.

4. A method as described in claim 1 wherein said solid source material is continuously produced by introducing over said liquid solution a gas mixture of a carrier gas and the vapor of the constituents and/or the volatile compounds of the constituents of said semiconductor.

5. A method as described in claim 4 wherein the composition and/or the doping level of said solid source material is controlled by controlling at least one of the conditions consisting of the partial pressure of said constituents, said volatile compounds of the constituents, and the partial pressure of the dopants in said gas mixture.

6. A method as described in claim 1 wherein said semiconductor is a Group III–V semiconductor or a Group III–V mixed semiconductor.

7. A method as described in claim 1 wherein said semiconductor is a mixed semiconductor $A^{III}B^{V}_{1-x}C^{V}_{x}$, $x$ having a numerical value greater than zero and less than 1, $A^{III}$ being selected from the elements consisting of Al, Ga and In, and $B^{V}$ and $C^{V}$ being two different kinds of the element selected from N, P, As and Sb, and which is characterized by producing said solid source material in a film on said liquid solution by introducing a gas mixture of the vapor containing the $B^{V}$ element or the volatile compound of the $B^{V}$ element and the vapor containing the $C^{V}$ element or the volatile compound of the $C^{V}$ element, and supersaturating said liquid solution with the $B^{V}$ element and the $C^{V}$ element, and controlling the composition of said solid source material by controlling the ratio of the partial pressure of the $B^{V}$ element and the partial pressure of the $C^{V}$ element in said gas mixture over said liquid solution.

8. A method as described in claim 1 wherein at least two kinds of said liquid solution are provided at different locations, and which is characterized by growing said epitaxial layer with a multi-layer structure on said substrate by contacting said substrate with the first liquid solution during a predetermined period and contacting said substrate successively with the second liquid solution during a predetermined period.

9. A method as described in claim 8 wherein said epitaxial layer having a multi-layer structure is formed with each layer having a different composition and/or different kind of dopant and a different doping level.

10. A method for successively growing single crystal epitaxial layers of semiconductors which have the ternary or more multi-component homogeneous composition and/or uniform doping level in the binary or more multi-component semiconductors on suitable substrates from the liquid phase comprising the steps of:

applying heat to a molten metallic solvent solution unsaturated with said semiconductor and thereby establishing a temperature gradient therein with a high temperature region and a low temperature region;

contacting at least one substrate surface with the low temperature region of said solution to supply a small amount of said liquid solution onto said substrate;

transferring said substrate with the small amount of said solution thereon into a different location and there contacting a solid source material with the high temperature region of said small amount of solution so that said source material dissolves into said high temperature region of said solution and saturates said solution with said semiconductor such that at least a portion of said solid source material acquires an undissolved state thereby growing the epitaxial layers on the substrate by diffusion of the dissolved source material through said solution and supersaturation of said material in the low temperature region;

maintaining the temperatures in said solution constant during said epitaxial growth;

controlling the composition and/or doping level of said epitaxial layers by selecting substantially equal composition and/or doping level of the undissolved solid source material to said semiconductor to be grown;

contacting at least one other substrate surface with said solution unsaturated with said semiconductor for successive growth of epitaxial layers on a plurality of different substrate portions.

11. A method as described in claim 10 wherein said semiconductor is a Group III–V ternary mixed semiconductor and said substrate is a Group III–V binary semiconductor, and which is characterized by saturating said liquid solution unsaturated with said semiconductor only with said binary semiconductor, and after the epitaxial layer of said III–V binary semiconductor begins to grow on said substrates, contacting said solid source material with the high temperature region of said small amount of solution.

12. A method as described in claim 10 which is characterized by removing said treated substrates from contact with said small amount of solution at a predetermined location.

13. A method as described in claim 10 wherein said solid source material is continuously produced by introducing over said small amount of solution a gas mixture of a carrier gas and the vapor of the constituents and/or the volatile compounds of the constituents of said semiconductor with or without the dopant gas.

* * * * *

UNITED STATES PATENT OFFICE
CERTIFICATE OF CORRECTION

PATENT NO. : 3,933,538

DATED : January 20, 1976

INVENTOR(S) : Shin-ichi Akai, Hideki Mori, Nobuo Takahashi and Shin-ichi Iguchi

It is certified that error appears in the above-identified patent and that said Letters Patent are hereby corrected as shown below:

Cols. 3 and 4, in the Table, the last line under "atmospheres" column, insert -- " --

Col. 4, line 1, before "and" insert --$AsH_3$ vapor,--

Col. 6, lines 18 and 19, correct "$A^{III}B^{V-}1_{-x}C^V x$" to --$A^{III}B^V_{1-x}C^V_x$--

Col. 9, line 43, erase "x=4" and substitute --x=0.4--

Col. 12, line 10, erase "$\alpha$" and substitute --$\alpha$--

Col. 12, line 23, erase "to" and substitute --of--

Col. 13, line 29, after "gas" insert --91--

Col. 13, line 57, before "of" insert --,--

Col. 14, line 31, erase "x" and substitute --$x$--

Col. 14, line 46, erase "x" and substitute --$x$--

Signed and Sealed this

Fourteenth Day of September 1976

[SEAL]

Attest:

RUTH C. MASON
*Attesting Officer*

C. MARSHALL DANN
*Commissioner of Patents and Trademarks*